(12) United States Patent
Dabral et al.

(10) Patent No.: US 6,417,688 B1
(45) Date of Patent: Jul. 9, 2002

(54) METHOD AND APPARATUS FOR IMPLEMENTING A HIGHLY ROBUST, FAST, AND ECONOMICAL FIVE LOAD BUS TOPOLOGY BASED ON BIT MIRRORING AND A WELL TERMINATED TRANSMISSION ENVIRONMENT

(75) Inventors: Sanjay Dabral, Palo Alto; Ming Zeng, San Jose, both of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/476,585

(22) Filed: Dec. 31, 1999

(51) Int. Cl.$^7$ .................. H03K 17/16; H03K 19/003
(52) U.S. Cl. ................ 326/30; 326/82; 326/86; 326/90; 361/760
(58) Field of Search ................. 326/30, 82, 86, 326/90; 361/760

(56) References Cited

U.S. PATENT DOCUMENTS

| | | | | |
|---|---|---|---|---|
| 4,766,334 A | * | 8/1988 | Warner | 326/56 |
| 5,274,671 A | * | 12/1993 | Johnson | 375/257 |
| 5,347,177 A | * | 9/1994 | Lipp | 326/30 |
| 5,502,621 A | * | 3/1996 | Schumacher et al. | 361/760 |
| 5,528,168 A | * | 6/1996 | Kleveland | 326/30 |
| 5,638,402 A | * | 6/1997 | Osaka et al. | 375/257 |
| 5,982,192 A | * | 11/1999 | Saito | 326/30 |
| 6,097,208 A | * | 8/2000 | Okajima et al. | 326/26 |
| 6,128,685 A | * | 10/2000 | Cronin | 710/126 |
| 6,232,792 B1 | * | 5/2001 | Starr | 326/30 |
| 6,239,619 B1 | * | 5/2001 | Yuan et al. | 326/86 |

* cited by examiner

Primary Examiner—Michael Tokar
Assistant Examiner—Steven S. Park
(74) Attorney, Agent, or Firm—Blakely, Sokoloff, Taylor & Zafman LLP

(57) ABSTRACT

In one embodiment, the invention is a method of forming a bus. A first conductor having a first impedance is provided, the first conductor is routed through a fifth chip. Coupling of the first conductor to a first chip with a first termination impedance occurs. Coupling of the first conductor to a second chip with a second termination impedance occurs. Coupling of the first conductor to a third chip with a third termination impedance occurs, and coupling of the first conductor to a fourth chip with a fourth termination impedance occurs.

14 Claims, 13 Drawing Sheets

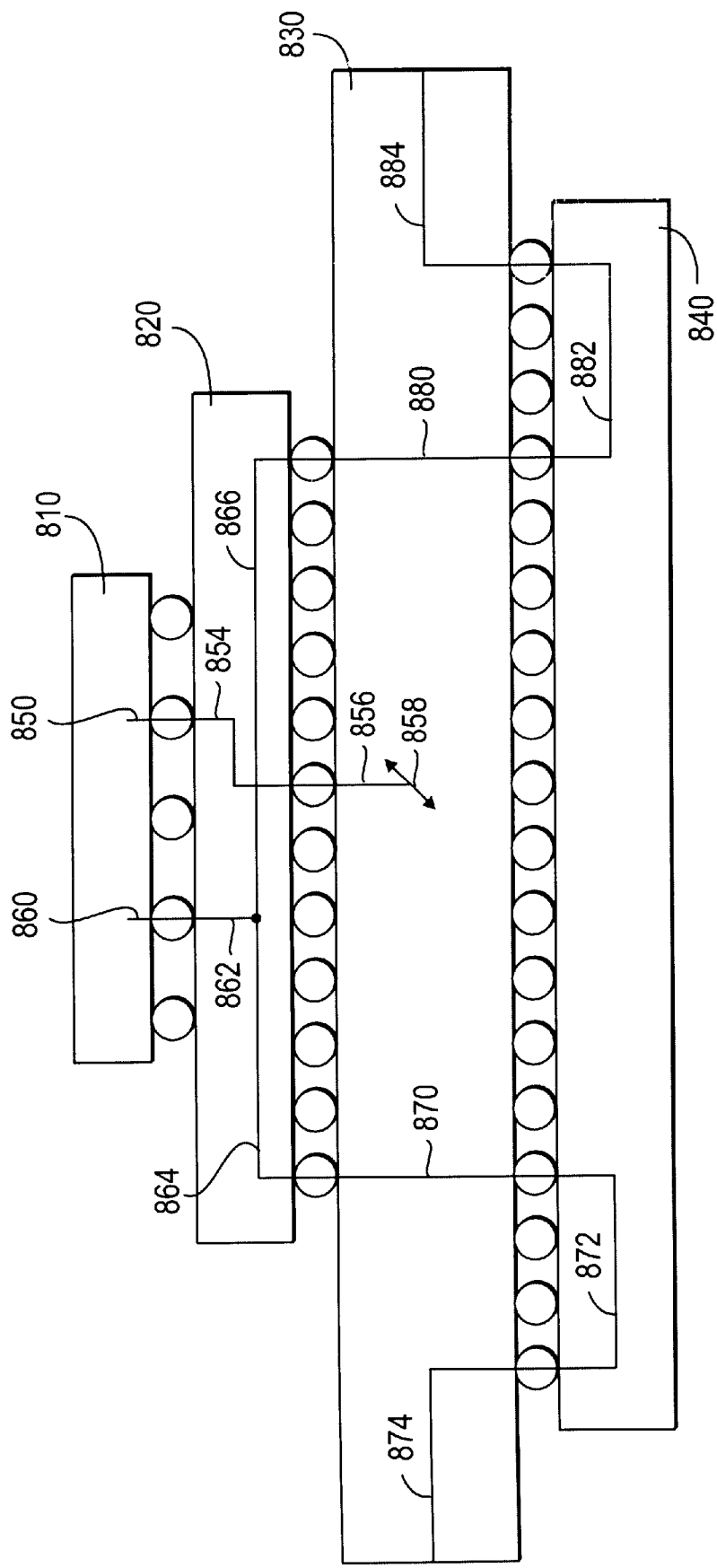

METHOD AND APPARATUS FOR IMPLEMENTING A HIGHLY ROBUST, FAST, AND ECONOMICAL FIVE LOAD BUS TOPOLOGY BASED ON BIT MIRRORING AND A WELL TERMINATED TRANSMISSION ENVIRONMENT

BACKGROUND OF THE INVENTION

1. Field of the Invention

The invention relates generally to integrated circuit and printed circuit board design and manufacture and more specifically to design and manufacture of integrated circuits and printed circuit boards in which a large number of loads on a bus must be driven.

2. Description of the Related Art

Printed circuit boards have long contained buses or conductors that could be driven by more than one driver at a time. Likewise, these buses were also often connected to multiple receivers. With relatively small printed circuit boards and/or relatively low frequency signals, these buses did not cause significant delays and noise created by multiple reflections on these buses did not present too much trouble. However, as processing speeds requiring higher bandwidth delays caused by and noise generated by reflections on multi-load buses and other connections on printed circuit boards assume an increasing importance.

Previously, a method for creating a five load bus that can handle moderate signaling rate of newer integrated circuits has been available. At higher rates, it is essential to reduce reflections and get the bus to settle down quickly. The best known topology of buses was suitable for connection directly to only four loads. In prior art systems, such a four load bus was useful as there were often only two or three devices which would drive a bus or receive signals from a bus. Five load systems are useful in current system configurations, consisting primarily of four processor agents and one node controller chip. The previous four load topology cannot be directly scaled to this five load configuration. At the same time, accesses by the processors or memory management device to the bus must be fast enough to satisfy the demands of the processors for data input/output functions.

Illustrated in FIG. 1A is a common prior art bus topology as applied to a five load bus. Driver/receiver 10 is coupled to stub 15 which in turn is coupled to bus 60. Driver/receiver 20 is coupled to stub 25 which in turn is coupled to bus 60. Similarly, driver/receiver 30 is coupled to stub 35 which is coupled to bus 60, driver/receiver 40 is coupled to stub 45 which is coupled to bus 60, and driver/receiver 50 is coupled to stub 55 which is coupled to bus 60. Bus 60 is terminated at one end by termination resistor 70 and power supply 75, and bus 60 is terminated at the other end by termination resistor 80 and power supply 85.

As is illustrated, driver/receiver 10 drives the bus, and causes a reflection on stub 15. The signal propagates through the bus, and reflections are also observed on stubs 25, 35, 45, and 55. These reflections appear as noise to the main signal on the bus and increase the settling time required between driving distinct signals on the bus. Ultimately, this noise limits the maximum frequency which may be achieved with this bus.

SUMMARY OF THE INVENTION

In one embodiment, the invention is a method of forming a bus. A first conductor having a first impedance is provided, the first conductor is routed through a fifth chip. Coupling of the first conductor to a first chip with a first termination impedance occurs. Coupling of the first conductor to a second chip with a second termination impedance occurs. Coupling of the first conductor to a third chip with a third termination impedance occurs, and coupling of the first conductor to a fourth chip with a fourth termination impedance occurs.

BRIEF DESCRIPTION OF THE DRAWINGS

The present invention is illustrated by way of example and not limitation in the accompanying figures.

FIG. 8 illustrates a side view of connections between a packaged integrated circuit, an interposer, a printed circuit board, and an underposer.

DETAILED DESCRIPTION

A method and apparatus for implementing a highly robust, fast, and economical five load bus topology based on bit mirroring and a well terminated transmission environment is described. In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in the specification to "one embodiment" or "an embodiment" means that a particular feature, structure, or characteristic described in connection with the embodiment is included in at least one embodiment of the invention.

The appearances of the phrase "in one embodiment" in various places in the specification are not necessarily all referring to the same embodiment, nor are separate or alternative embodiments mutually exclusive of other embodiments.

Figure 1A:
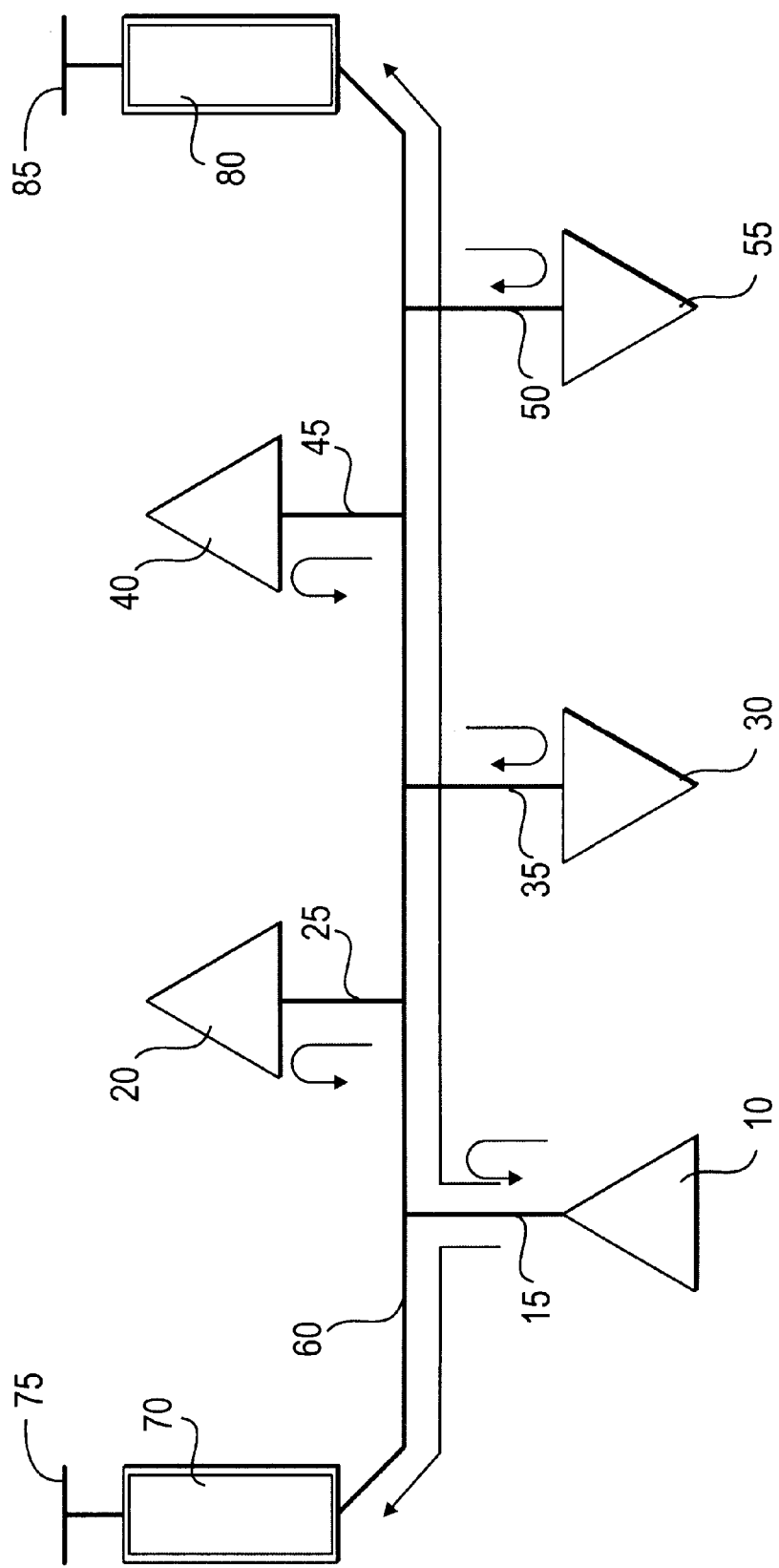
FIG. 1A illustrates the multiple reflections caused in a five load bus, thereby limiting bus speed.
Figure 1B:
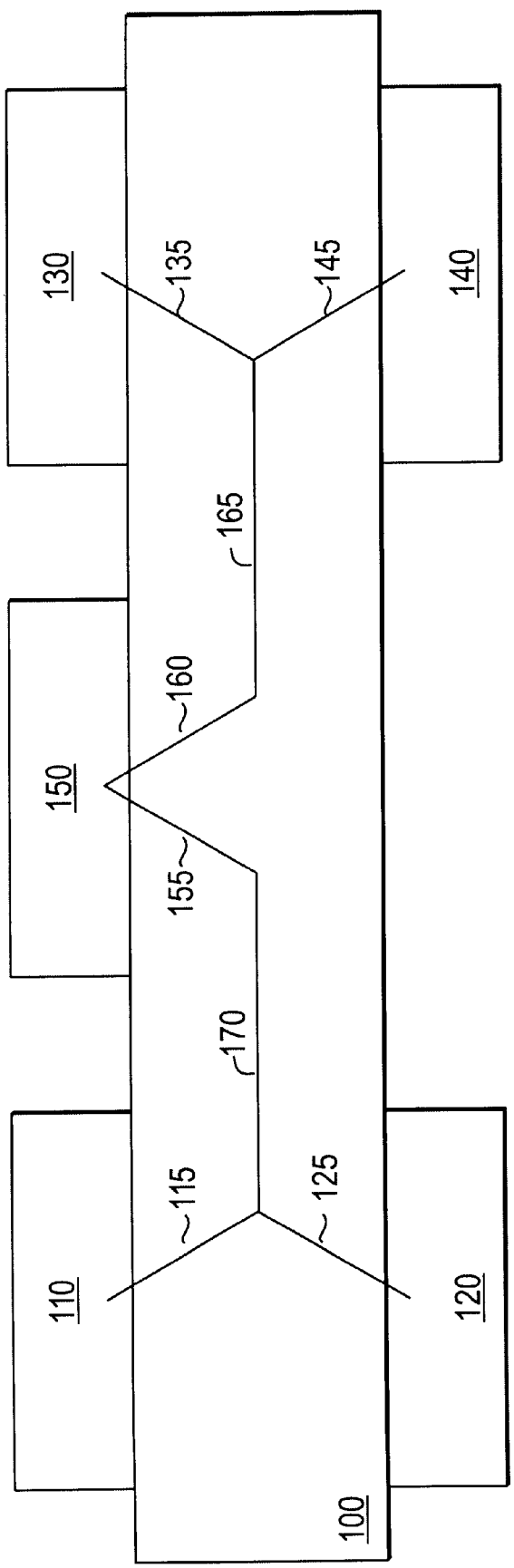
FIG. 1B illustrates a side view of a five load bus.

Turning to FIG. 1B, printed circuit board 100 is illustrated. Mounted on printed circuit board are integrated circuit 110, integrated circuit 120, integrated 130 and integrated circuit 140. Also mounted on printed circuit board 100 is integrated circuit 150. Integrated circuits 110, 130 and 150 are mounted on the top surface of printed circuit board 100. Integrated circuits 120 and 140 are mounted on the bottom surface of printed circuit board 100. Note that integrated circuits 110, 120, 130 and 140 are shown packaged. Lead 115 couples a signal from integrated circuit 110 to lead 170. Likewise lead 125 couples a signal from integrated circuit 120 to lead 170. Lead 170 is coupled to lead 155 which connects to integrated circuit 150. Lead 135 couples integrated circuit 130 to lead 165. Similarly, lead 145 couples integrated circuit 140 to lead 165. Lead 165 is coupled to lead 160 which is also coupled at the same point to integrated circuit 150. As a result signals coupled to lead 115, lead 125, lead 135 and lead 145 are all coupled together. This effectively creates a five load topology. Each of integrated circuits 110, 120, 130, 140 and 150 may drive the signal on the network of leads including leads 115, 125, 135, 145, 155, 160, 165 and 170. In the prior art such a five load topology would likely result in ringing effects and similar noise problems on a printed circuit board. Leads as used in this context include conductors such as traces or wires on or in printed circuit boards, pins, solder balls, wires, or other conductors in integrated circuit packages, and other conductors. Signals as used in this context are electrical signals having a voltage and a current.

Figure 2:
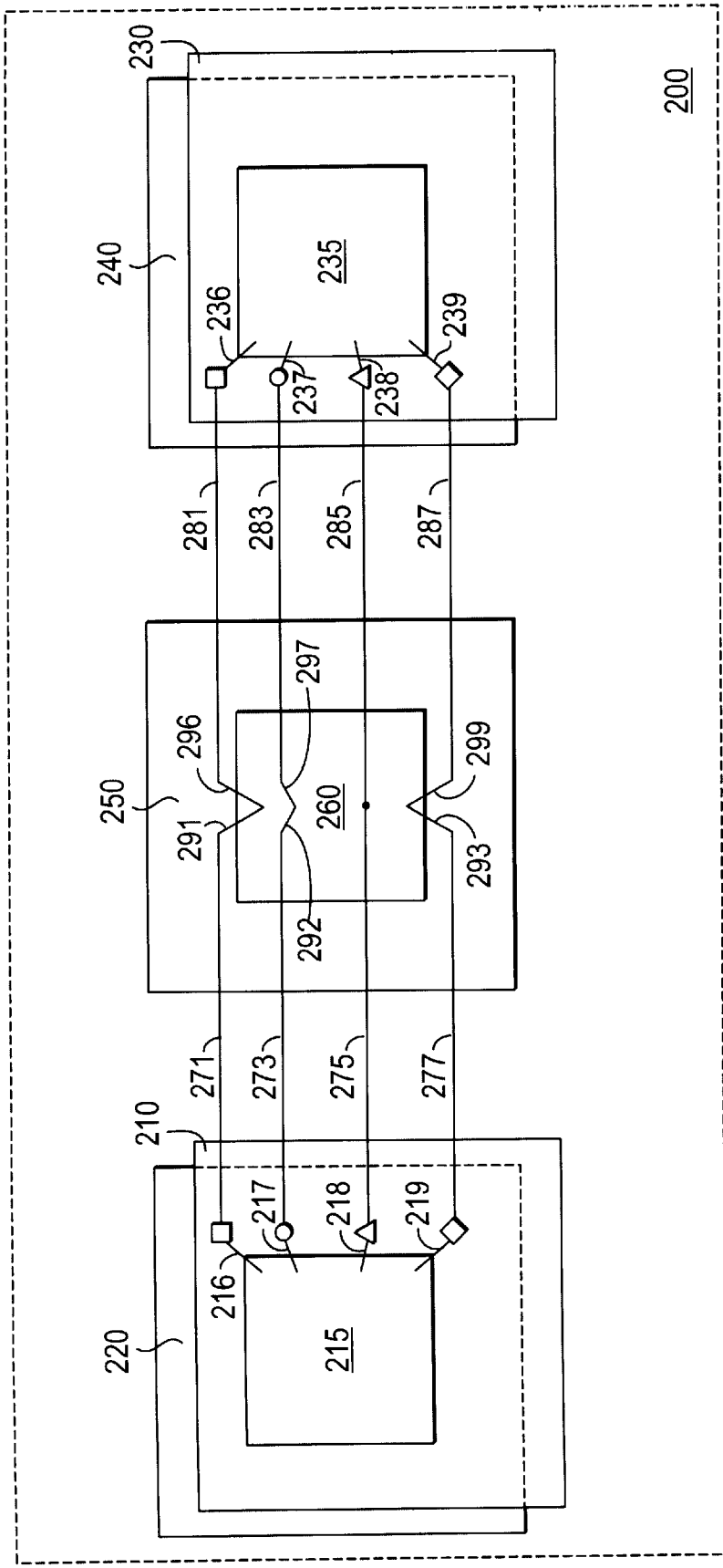
FIG. 2 illustrates a top view of several signals in a five load bus.

Turning to FIG. 2, another illustration of a printed circuit board, printed circuit board 200 is shown. Package 210, package 230 and package 250 are each mounted on printed circuit board 200. Package 230 contains integrated circuit 235. Package 250 contains integrated circuit 260 and package 210 contains integrated circuit 215. Mounted on the bottom surface of printed circuit board 200 of package 220 and package 240. Both package 220 and package 240 also include integrated circuits which are not shown. Lead 216 is coupled to integrated circuit 215 in package 210. Lead 271 is coupled to lead 216 and resides within printed circuit board 200. Lead 291 is coupled to lead 271 and also to integrated circuit 260. Lead 291 resides within package 250. Lead 216 resides within package 210. Effectively, leads 216, 271 and 291 couple a signal from integrated circuit 215 to integrated circuit 260. A similar lead couples the integrated circuit in package 220 to lead 271. Integrated circuit 235 is coupled to lead 236. Lead 236 resides within the package 230. Lead 281 is coupled to lead 236 and resides within printed circuit board 200. Lead 296 is coupled to integrated circuit 260 and to lead 281 and resides substantially within package 250. Lead 296 is also coupled to lead 291 at the point where lead 291 and lead 296 are coupled to integrated circuit 260. Similarly a lead couples the integrated circuit within package 240 to lead 281. That lead as with the lead coupling the integrated circuit in package 220 to lead 271 is not shown. Thus, a five load bus is implemented.

Similarly illustrated, lead 217 is coupled to both integrated circuit 215 and package 210 and resides substantially within package 210. Lead 273 is coupled to lead 217 and resides substantially within printed circuit board 200. Lead 292 is coupled to lead 273 and resides substantially within package 250. Lead 292 is also coupled to integrated circuit 260. Lead 297 is coupled to lead 292 at the point where lead 292 is coupled to integrated circuit 260 and also resides substantially within package 250. Lead 283 is coupled to lead 297 and resides substantially within printed circuit board 200. Lead 237 is coupled to lead 283 and to integrated circuit 235 and resides substantially within package 230. Likewise, there are leads not shown which couple the integrated circuit in package 240 to lead 283 and the integrated circuit in package 220 to lead 273 thus implementing another five load bus.

Lead 218 is coupled to integrated circuit 215 and to lead 275 and lead 218 resides substantially within package 210. Lead 275 resides substantially within printed circuit board 200 but also enters package 250 where it is coupled to lead 285. Lead 285 also resides substantially within printed circuit board 200 but also enters package 250. Lead 238 is coupled to lead 285 and to integrated circuit 235. Lead 238 resides substantially within package 230. Again, similarly to lead 238 a lead not shown resides substantially within package 240 and couples the integrated circuit of package 240 to lead 285. Similarly, a lead similar to lead 218 resides substantially within package 220 and couples the integrated circuit of package 220 to lead 275.

Lead 219 resides substantially within package 210 and couples integrated circuit 215 to lead 277. Lead 277 resides substantially within printed circuit board 200 and is coupled to lead 293. Lead 293 resides substantially within package 250 and couples lead 277 to integrated circuit 260. At the same point where lead 293 couples to integrated circuit 260, lead 299 couples to integrated circuit 260. Lead 299 also couples to lead 287 and resides substantially within package 250. Lead 287 resides substantially within printed circuit board 200 and is coupled to lead 239. Lead 239 resides substantially within package 230 and is coupled to integrated circuit 235. Additionally, a lead similar to lead 239 resides substantially within package 240 and couples the integrated circuit of package 240 to lead 287. Moreover, a lead similar to lead 219 resides within package 220 and couples the integrated circuit of package 220 to lead 277. Effectively, leads 219 and the corresponding lead within package 220, lead 277, lead 293, lead 299, lead 287, lead 239 and the lead corresponding to lead 239 within package 240 form another five load bus.

As will be appreciated, the leads used to form the buses in FIG. 2 are preferably formed such that the buses are of a symmetrical form, and such that the signals from or to the fifth load (fifth chip) travel a nearly electrically identical path from or to the other four loads of the bus. Two electrically identical paths typically involve two spatially identical paths, but actually depend on having similar (preferably identical) impedance to the signals traveling the two paths.

Figure 3A:
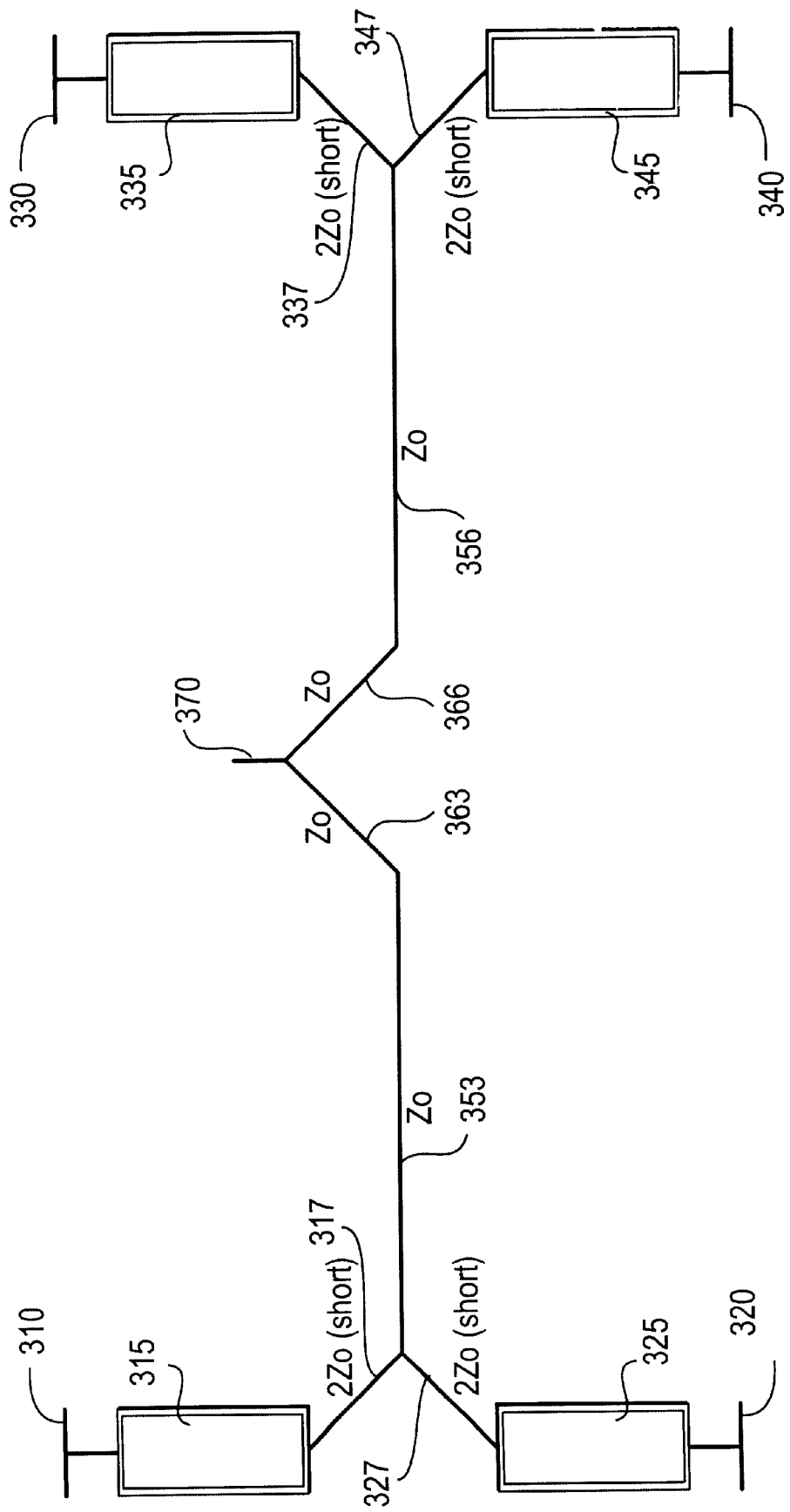
FIG. 3A illustrates an embodiment of a five load bus.

Turning to FIG. 3A, a schematic for such a five load bus is illustrated. Rail (Vcc, Power Supply, or Ground for example) 310 is coupled to element 315. Element 315 is a combination of a bus driver and a bus terminator, and may also include a bus receiver. An illustration of the bus driver component and the bus terminator component follows in FIGS. 3B and 3C, and the corresponding descriptions. In one embodiment, element 315 and rail 310 are both part of an integrated circuit. Element 315, when driving the bus has a driver impedance (typically resistance) of approximately $Z_0$ or less, and when terminating the bus has a termination resistance of approximately $2Z_0$. Element 315 is coupled to lead 317. Lead 317 has an impedance of approximately $2Z_0$ and is preferably a short lead. Lead 317 is coupled to lead 353 which in turn is coupled to lead 363. Lead 353 has an impedance of approximately $Z_0$ and lead 363 has an impedance of approximately $Z_0$.

Rail 320 is coupled to element 325 which in turn is coupled to lead 327 which in turn is coupled to both lead 317 and lead 353. Element 325 is preferably structured similarly to element 315, with similar electrical properties. Rail 320 and element 325 may be incorporated in an integrated circuit. Lead 327 is preferably a short lead with an impedance of approximately $2Z_0$. Rail 330 is coupled to element 335 which in turn is coupled to lead 337. Element 335 is preferably similarly structured to element 315, with similar electrical properties. Lead 337 is preferably a short lead with an impedance of approximately $2Z_0$. Rail 340 is coupled to element 345 which in turn is coupled to lead 347. Element 345 is preferably similarly structured to element 315, with similar electrical properties. Lead 347 is preferably a short lead with an impedance of approximately $2Z_0$.

Lead 347 is coupled to lead 337, both lead 347 and lead 337 are coupled to lead 356 which in turn is coupled to lead 366. Lead 356 has an impedance of approximately $Z_0$ and lead 366 has an impedance of approximately $Z_0$. Lead 366 is coupled to lead 363 and to lead or stub 370. Not shown here is that lead 370 is coupled to a fifth integrated circuit such as integrated circuit 260 of FIG. 2.

Likewise element 315 may be part of a first integrated circuit such as integrated circuit 215 of FIG. 2. Element 325 may be part of a second integrated circuit such as the integrated circuit included within package 220 of FIG. 2. Element 335 may be part of a third integrated circuit such as integrated circuit 235 of FIG. 2 and element 345 may be part of a fourth integrated circuit such as the integrated circuit of package 240 of FIG. 2. It will be appreciated that stub 370 need not be present where leads 363 and 366 are coupled directly to an integrated circuit such as a fifth integrated circuit.

Moreover, leads 317, 327, 337 and 347 preferably have an impedance equal to twice that of the impedance of lead 353. Similarly, each of leads 353 and 363 preferably have an impedance equal to one half that of the impedance of the terminator portion of element 315. Likewise, preferably each of leads 356 and 366 have an impedance equal to one half that of the impedance of the terminator portion of element 315. If the terminator portions of elements 315, 325, 335 and 345 all have roughly the same impedances, this will result in essentially reducing reflections and other transmission line effects which would otherwise delay or distort the signals driven out by the driver portions of elements 315, 325, 335 and 345. Moreover, the integrated circuit coupled to lead 370 or to the junctions of leads 363 and 366 preferably has a driver resistance of approximately one-quarter that of the terminator portion of elements 315, 325, 335, and 345 individually (one-half of the impedance of leads 353 and 363 individually). Then that termination resistance may also damp out the transmission line effects caused by the leads on the printed circuit board.

Figure 3B:
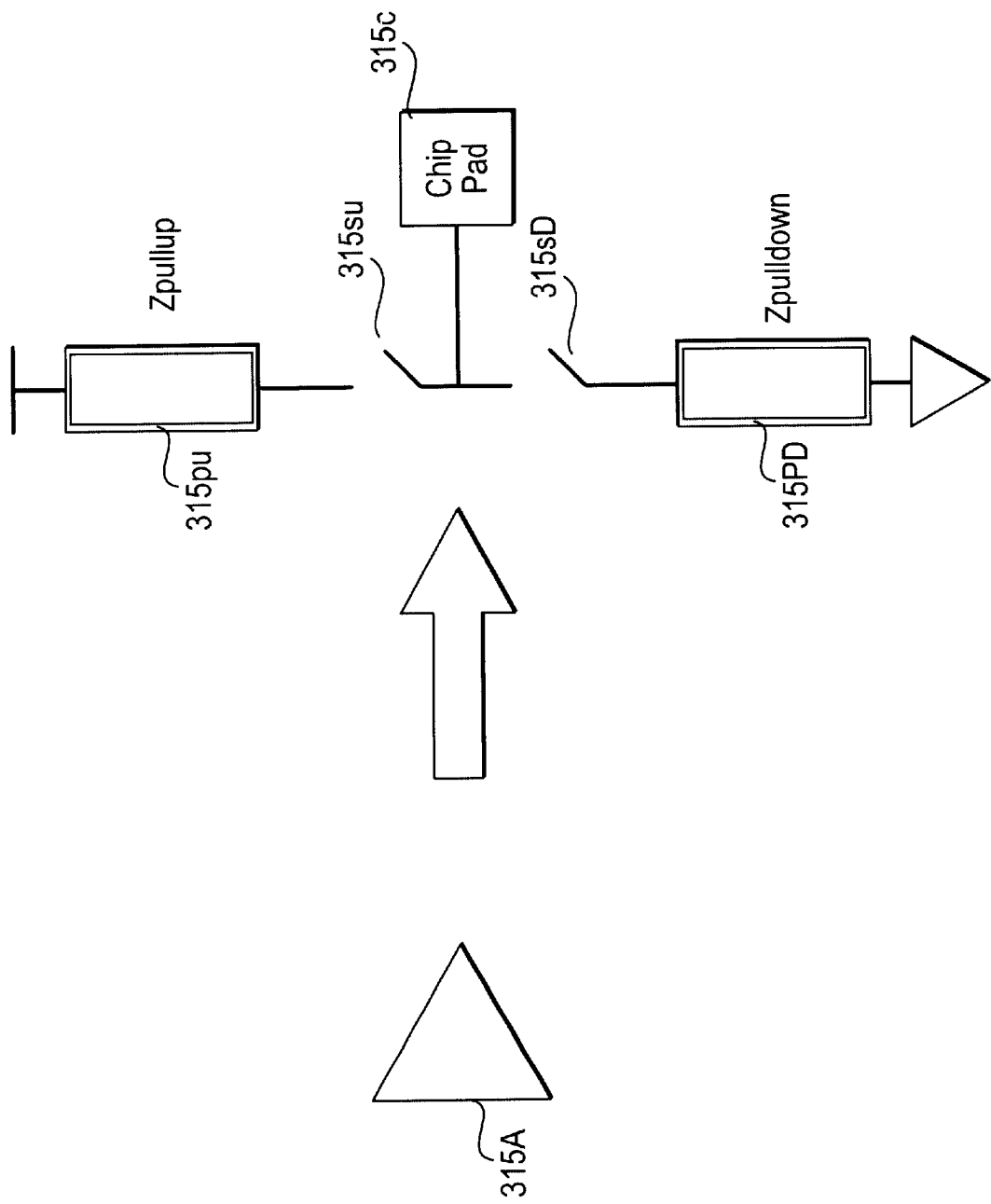
FIG. 3B illustrates one embodiment of the internal structure of a driver of a bus such as an embodiment of a five load bus.
Figure 3C:
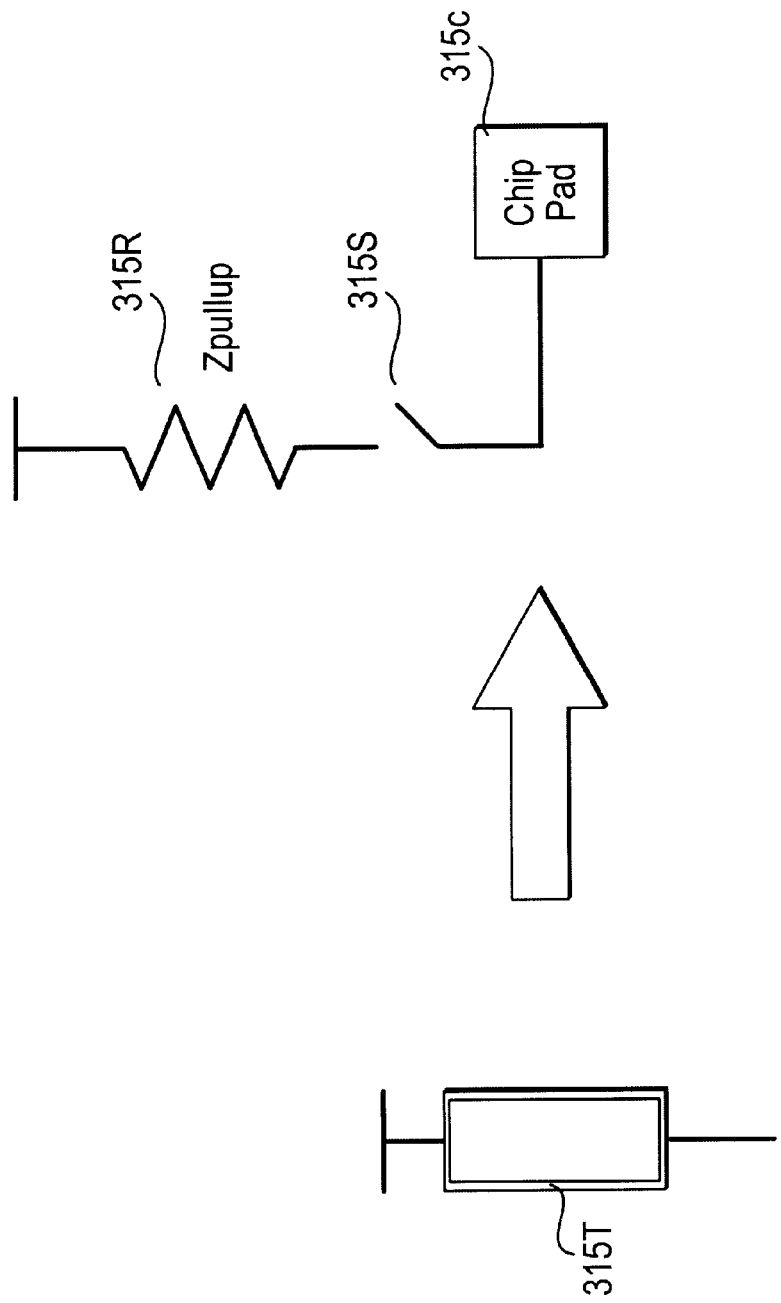
FIG. 3C illustrates one embodiment of the internal structure of a termination resistor or terminator of a bus such as an embodiment of a five load bus.

Turning to FIGS. 3B and 3C, the driver and terminator portions of element 315 in one embodiment are illustrated. Driver symbol 315A is shown as equivalent to the structure illustrated. Pullup 315PU is coupled to a power supply rail and to switch 315SU. Switch 315SU is coupled to chip pad 315C. Chip pad 315C is also coupled to switch 315SD, which in turn is coupled to pulldown 315PD. Pulldown 315PD is coupled to a ground rail. Pullup 315PU and pulldown 315PD as well as switch 315SU and switch 315SD will be understood to be portions of a driver or buffer structure.

Likewise, terminator portion 315T is shown as equivalent to the structure illustrated. Pullup resistor 315R is coupled to a power supply rail and to switch 315S. Switch 315S is coupled to chip pad 315C. As will be appreciated, both structures may be connected to the same chip pad 315C, such that pullup resistor 315R may be connected to the chip pad when buffer 315A is not driving, and disconnected when buffer 315A is driving. In one embodiment, the pullup resistors 315R are made from a MOS or N-Well resistor, and the switch connecting the pullup resistor 315R to the chip pad 315C is closed unless the driver corresponding to the pullup resistor 315R is driving.

It will further be appreciated that the pullup 315PU and the pullup resistor 315R may be formed from the same structure in one embodiment. Through use of additional logic, a device may be constructed which functions as the pullup 315PU in a buffer such as a push-pull buffer and functions as the pullup resistor 315R. Furthermore, in one embodiment the switches 315S and 315SU may be a single switch serving both functions. The logic used to connect either the driver portion or the terminator portion of element 315 may be created relatively simply, whether the terminator portion and the driver portion are completely separate components or whether they share some components.

Figure 4A:
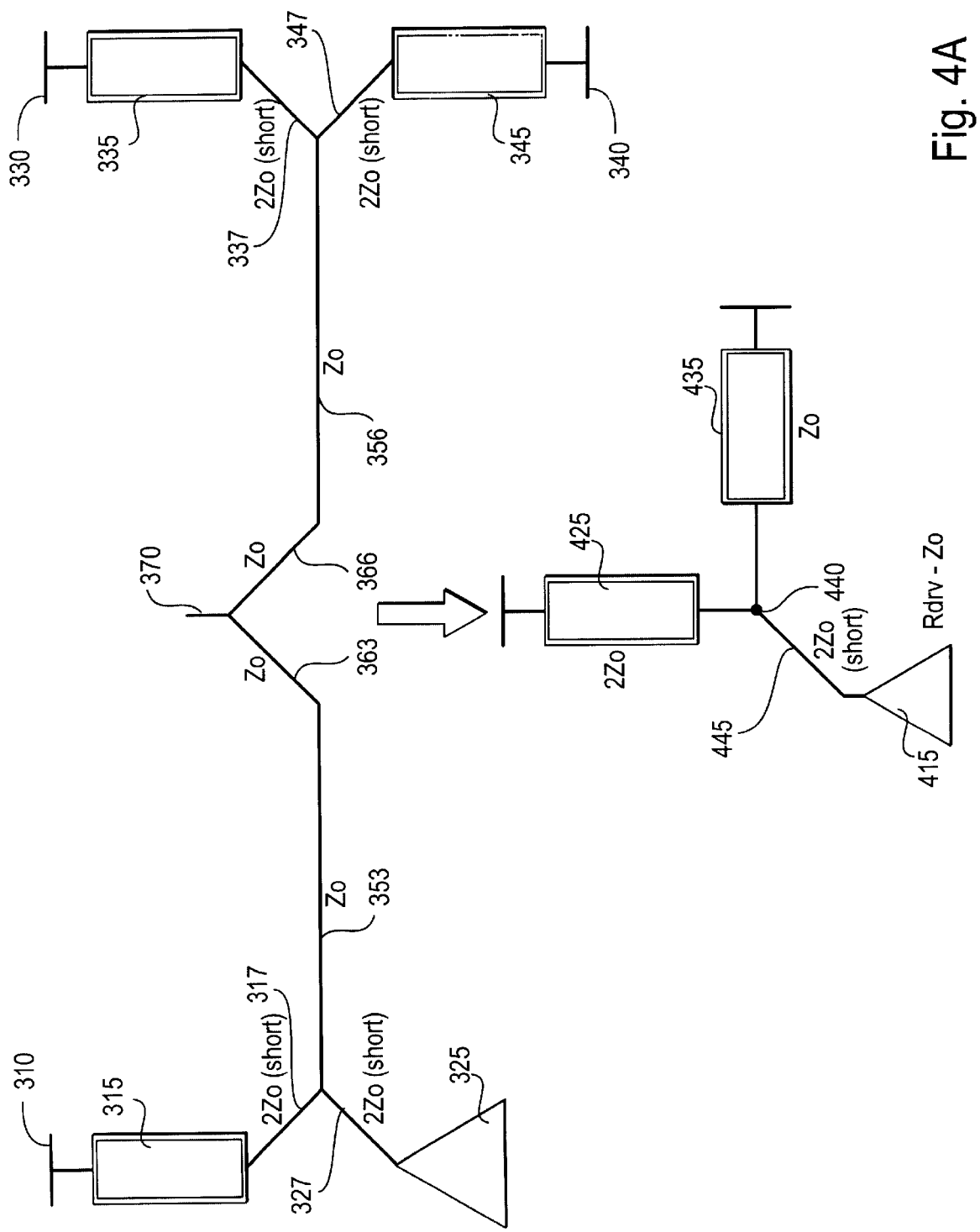
FIG. 4A illustrates the impedance seen by a signal source at the ends of the bus in an embodiment of a five load bus.

Turning to FIG. 4A, the resistance network from the point of view of one of elements 315, 325, 335, or 345 is illustrated. Taking for example the element 325 as the signal source 415, the signal is driven by a driver having a driver impedance $Z_0$ or less, and encounters short stub 445 which is not terminated perfectly. However the stub 445 is small, thus having a small round trip time of flight for signals, and therefore settles quickly (resulting in a relatively short delay or less noise). The signal encounters at 440 the resistance 425 (with an impedance of $2Z_0$) which is a representation of the impedance of element 315 of FIG. 3. The signal also encounters at 440 the impedance 435 (with a value of $Z_0$) which represents the impedance of the rest of the network. Segment or lead 445 is the only portion of the network which is not properly terminated and otherwise effectively eliminated from parasitic delays or transmission line effects, and may correspond to stub (lead) 327 of FIG. 3. For improved termination capability, one can employ a current source driver in parallel to a $Z_0$ termination, too.

Figure 4B:
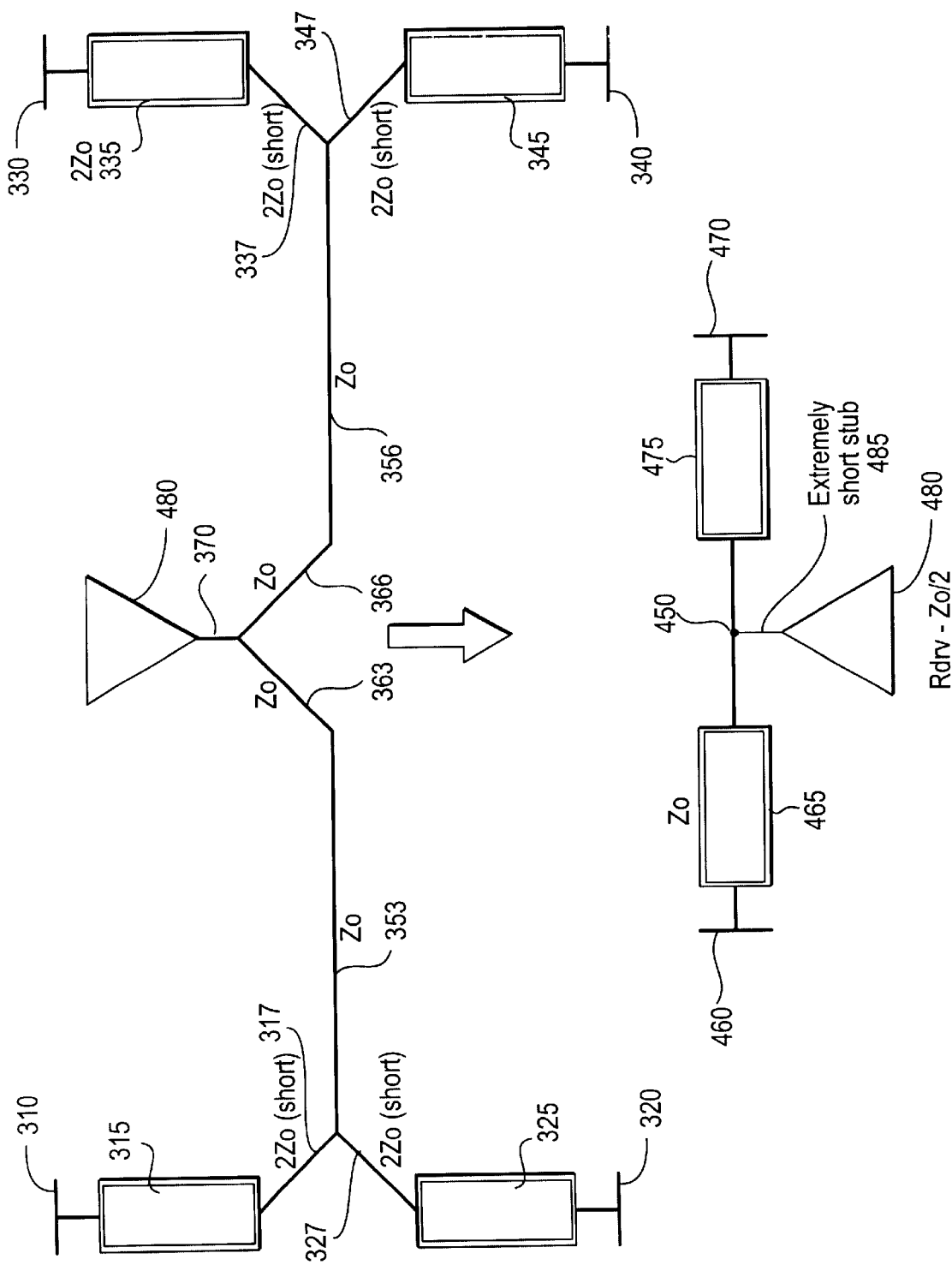
FIG. 4B illustrates the impedance seen from the central signal source in a five load bus.

Turning to FIG. 4B, a resistance network as seen by a fifth integrated circuit such as the integrated circuit coupled to stub 370 or stubs 363 and 366 of FIG. 3 is illustrated. Looking out from the driver 480 towards the left, the signal encounters a transmission line 363 having impedance $Z_0$, and two stubs in parallel each having impedance of $2Z_0$, but these stubs are terminated with an impedance of $2Z_0$ each. Therefore this whole left path can be idealized to a resistor of $Z_0$, and is represented as resistor (transmission line) 465 in FIG. 4B. A similar idealization follows for resistor (transmission line) 475. In one embodiment, stubs (leads 363 and 366 are wires within the package of the fifth integrated circuit).

In this illustration the signal is being driven out to four other signal sources or signal receivers along the two transmission lines illustrated. The signal is being driven out from node 450 by driver 480 having a driver impedance of approximately $Z_0/2$. Driver 480 is coupled to node 450 by stub 485 (which in one embodiment corresponds to stub 370). Transmission line 465 has an impedance of approximately $Z_0$ and is terminated at node 460. Transmission line 475 has an impedance of approximately $Z_0$ and is terminated at node 470. Each transmission line is well terminated, so the transmission line effects have been essentially removed.

Connecting node 450 to these two transmission lines means the driver is driving two loads with impedances of approximately $Z_0$ in parallel, meaning the driver effectively drives an impedance of approximately $Z_0/2$, and this effectively eliminates the transmission line effects of the leads. It will be appreciated that this results in a significantly cleaner signal than a signal in traditional nets or busses. Moreover it will be appreciated that by bringing the signal onto the fifth integrated circuit, or at least within the package of the fifth integrated circuit it becomes possible to set up this type of impedance network whereas in previous designs such an impedance network was not possible.

Figure 5A:
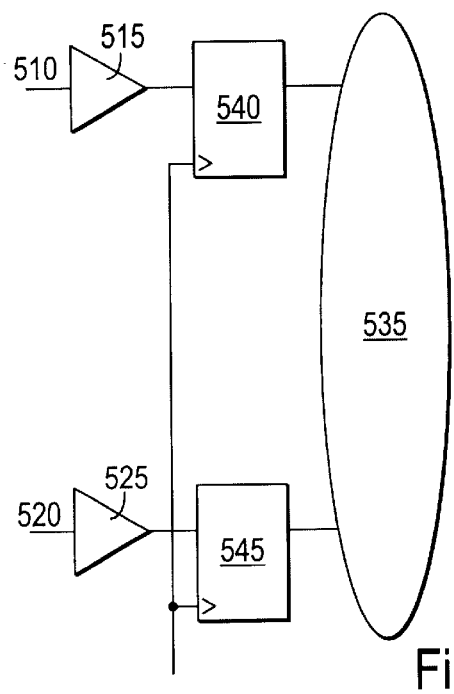
FIG. 5A illustrates a prior art scheme for organizing signals coupled to a bus.

Turning to FIG. 5A, a prior art illustration of connections on a printed circuit board or within the system is illustrated. Signal 510 is to coupled to buffer 515 which is coupled to register 540. Likewise signal 520 is coupled to buffer 525 which is coupled to register 545. Registers 540 and 545 are controlled by common clock 530. Both registers 540 and 545 are coupled to bus 535.

Figure 6A:
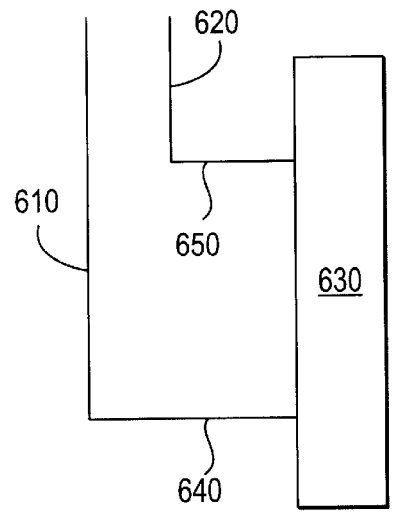
FIG. 6A illustrates a prior art chip layout of signals coupled to a bus.

Similarly, FIG. 6A illustrates an alternate view of the prior art system illustrated in FIG. 5A showing the leads necessary to connect registers such as registers 540 and 545 to bus 535. Lead 610 is coupled to lead 640 which connects to bus 630 which would correspond to bus 535 and lead 620 is coupled to lead 650 which connects to bus 630 as well. Lead 620 and 650 would be used to couple a register such as register 540 to bus 630 and lead 610 and 640 would be used to couple a register such as register 545 to bus 630.

Figure 5B:
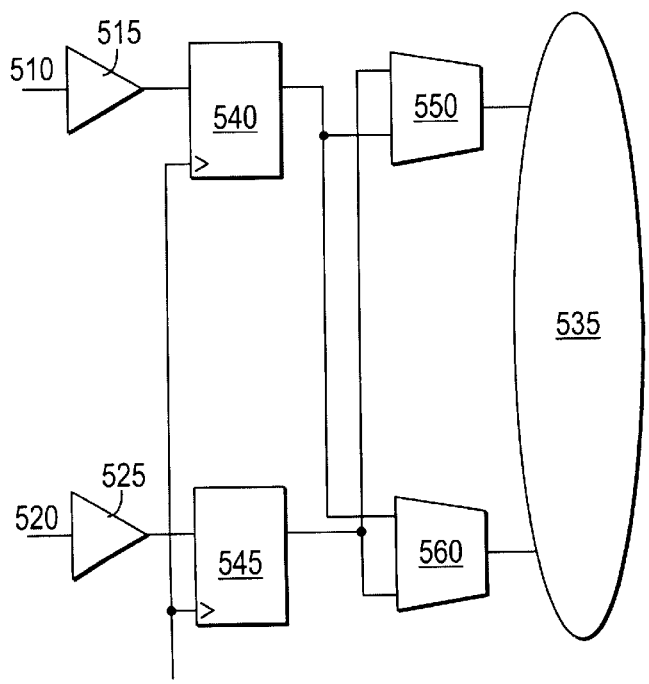
FIG. 5B illustrates a scheme for organizing signals coupled to a bus.

Turning to FIG. 5B, an alternative schematic for coupling signals to a bus is illustrated. Signal 510 is coupled to buffer 515 which is then coupled to register 540. Signal 520 is coupled to buffer 525 which is coupled to register 545. Both register 540 and register 545 are again controlled by common clock 530. However the output of register 540 is coupled to mux 560 or multiplexer 560 and also to mux 550 or multiplexer 550. Similarly register 545 has its output coupled to mux 550 and to mux 560. The outputs of both mux 550 and mux 560 are then coupled to bus 535. The select input of mux 550 and mux 560 may be hard wired at the time the printed circuit board is assembled such that mux 550 will select one of the two outputs from register 540 and register 545 and mux 560 will select the other output of register 540 and register 545, normally the output not selected by mux 550. As a result two signals are still routed to bus 535 but there are two alternatives as to how those signals are routed. It will be appreciated that this requires extra leads on the printed circuit board.

Figure 6B:
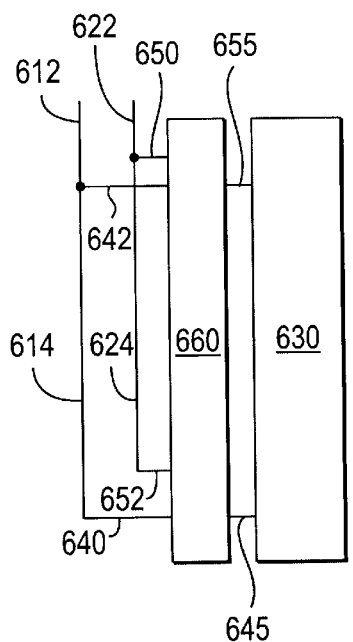
FIG. 6B illustrates a chip layout of signals coupled to a bus.

FIG. 6B illustrates the need for additional leads. Lead 612 and 614 have replaced lead 610. In addition to lead 640, lead 642 also connects to a bank of muxes 660. Similarly lead 622 and leads 624 replace lead 620. In addition to lead 650, lead 652 also connects to mux or bank of muxes 660. Lead 645 and lead 655 connect from the bank of muxes 660 to bus 630. This similarly shows that the bank of muxes 660 may be used to select which of the two paths the signals will use in propagating from a buffer to the bus. This method for allowing for two separate paths for these signals to propagate to the bus may be referred to as swizzling the signals. Signals which are swizzled have the valuable property of being switchable between these two paths, thus allowing for a path to be routed on one surface of a printed circuit board for one signal and on the opposite surface of a printed circuit board for another signal. An illustration of this follows.

Figure 7A:
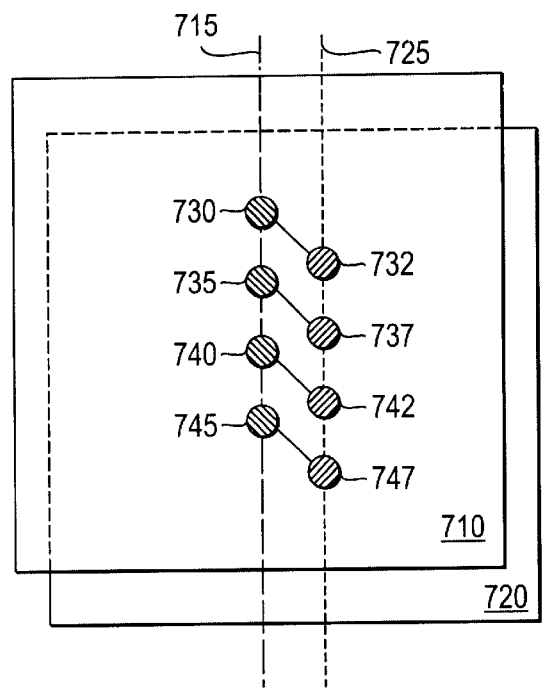
FIG. 7A illustrates a layout of connections from an integrated circuit for non-swizzleable signals.

Turning to FIG. 7A, an illustration of signals which may not be swizzled, is shown. Packaged integrated circuit 710 is mounted on a first surface of a printed circuit board. Packaged integrated circuit 720 is mounted on a second opposite surface of the printed circuit board. The center line of packaged integrated circuit 710 is line 715 and the center line of packaged integrated circuit 720 is line 725. Note that both of these lines effectively line up in the vertical direction on the integrated circuit but are shown offset for illustration purposes in what is essentially a perspective view. Pin 730 of package 710 is coupled to pin 732 of package 720. If package 710 and package 720 contain identical integrated circuits and identical configurations then pin 730 and pin 732 may be expected to have the same signal routed in and out of the corresponding integrated circuits and therefore may reasonably be coupled or connected. Likewise pin 735 of integrated circuit 710 is connected to pin 737 of integrated circuit 720. Similarly, pin 740 of integrated circuit 710 is connected to pin 742 of integrated circuit 720 and pin 745 of integrated circuit 710 is connected to pin 720 to pin 747 of integrated circuit 720. It will be appreciated that in each instance where these pins are connected they either drive or receive the same signals for corresponding integrated circuits and will intentionally be laid out in this manner. These signals would then be non-swizzleable, and all non-swizzleable signals would preferably be laid out along the center line of the packages for the integrated circuits in package 710 and package 720.

Figure 7B:
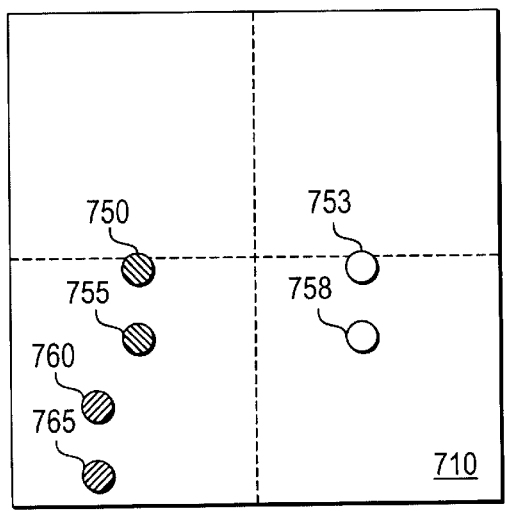
FIGS. 7B and 7C illustrate an alternative layout of connections from an integrated circuit package for non-swizzleable and swizzleable signals.

Turning to FIG. 7B, if all of the space in the center of package 710 taken up by non-swizzleable pins, this does not mean that other pins still need not be swizzled. The solution for this problem is illustrated. Pin 750 is a non-swizzleable pin as is pin 755. Pin 753 is another pin on package 710 which is in the mirror image position of pin 750 and pin 753 is left unconnected. As a result when the integrated circuit is flipped on its back relative to the current position shown in FIG. 7B, pin 750 will line up with pin 753 meaning that an integrated circuit 720 located on the back side of the printed circuit board to which integrated circuit 710 is connected to the front side may have its pin 750 coupled to pin 753 of integrated circuit 710. Likewise pin 758 is the mirror image position of pin 755 and is also left unconnected. On the other hand pin 760 and pin 765 are both swizzleable. As a result these two pins need not be taken care of by some special mechanism such as leaving the pins in their corresponding mirror image position on package 710 unconnected.

Figure 7C:
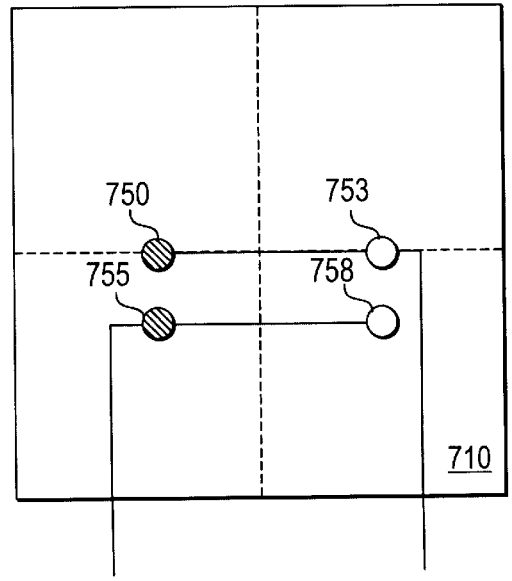

Turning to FIG. 7C, the connections between pin 750 and pin 753 are illustrated along with the connections between pin 755 and pin 758. As will be appreciated these connections would typically occur on the printed circuit board rather than within the integrated circuit or package thus allowing for the flexibility necessary for implementing the five load topology.

Implementing the five load topology may further involve use of an interposer or underposer as illustrated below. The interposer is a layer between the packaged integrated circuit and the printed circuit board which allows for flexibility in routing signals to the integrated circuit. Similarly, the underposer may sit on the printed circuit board on a surface opposite the surface on which the packaged integrated circuit is placed, such that the underposer occupies a similar space of the printed circuit board to that occupied by the packaged integrated circuit in terms of size and location. These features: use of interposers and underposers, bit swizzling, and termination of the leads (transmission lines) and sizing the leads such that buses are symmetrical and signals follow identical paths from a fifth chip to the other four chips of a five load bus, all allow for implementation of the five load bus topology. Furthermore, the five load bus topology preferably includes properly terminating all of the leads in the bus to substantially eliminate reflections or ringing on the bus.

It will be appreciated that the embodiments illustrated previously and in the following description provide one example of how these objectives may be achieved, and that alternate embodiments utilizing the same techniques and tuned to obtain the same objectives are within the spirit and scope of the invention. Furthermore, it will be appreciated that the embodiments illustrated so far only use five load topologies, but that by using similarly matched paths for buses this topology may be extended to six or more loads without incurring the performance penalties inherent in prior art bus topologies.

Turning to FIG. 8, the package 810 (containing an integrated circuit not shown) is connected to an interposer 820. Interposer 820 is connected to printed circuit board 830 and printed circuit board 830 is connected to underposer 840. Signal 860 is connected to lead 862 within underposer 840 which in turn is connected to lead 864. Lead 864 is then connected to lead 870 within printed circuit board 830. Lead 870 is connected to lead 872 within underposer 840 and lead 872 is connected to lead 874 within printed circuit board 830. Similarly, lead 866 is connected to lead 862. Lead 866 is then connected to lead 880 within printed circuit board 830. Lead 880 is connected to lead 882 within underposer 840 and lead 882 is connected to lead 884 within printed circuit board 830. As a result two conducting paths with similar (preferably identical) impedance and length are found from lead 862 to other portions of printed circuit board 830.

Additionally signal 850 is coupled to lead 854 of interposer 820. Lead 856 of printed circuit board 830 is coupled to lead 854. Finally lead 856 is coupled to lead 858 which runs within printed circuit board 830 and in a direction perpendicular to the direction of leads 874 and 884. As a result a set of two similar or preferably identical conducting paths are formed to couple lead 858 to similar portions of printed circuit board 830.

Figure 9:
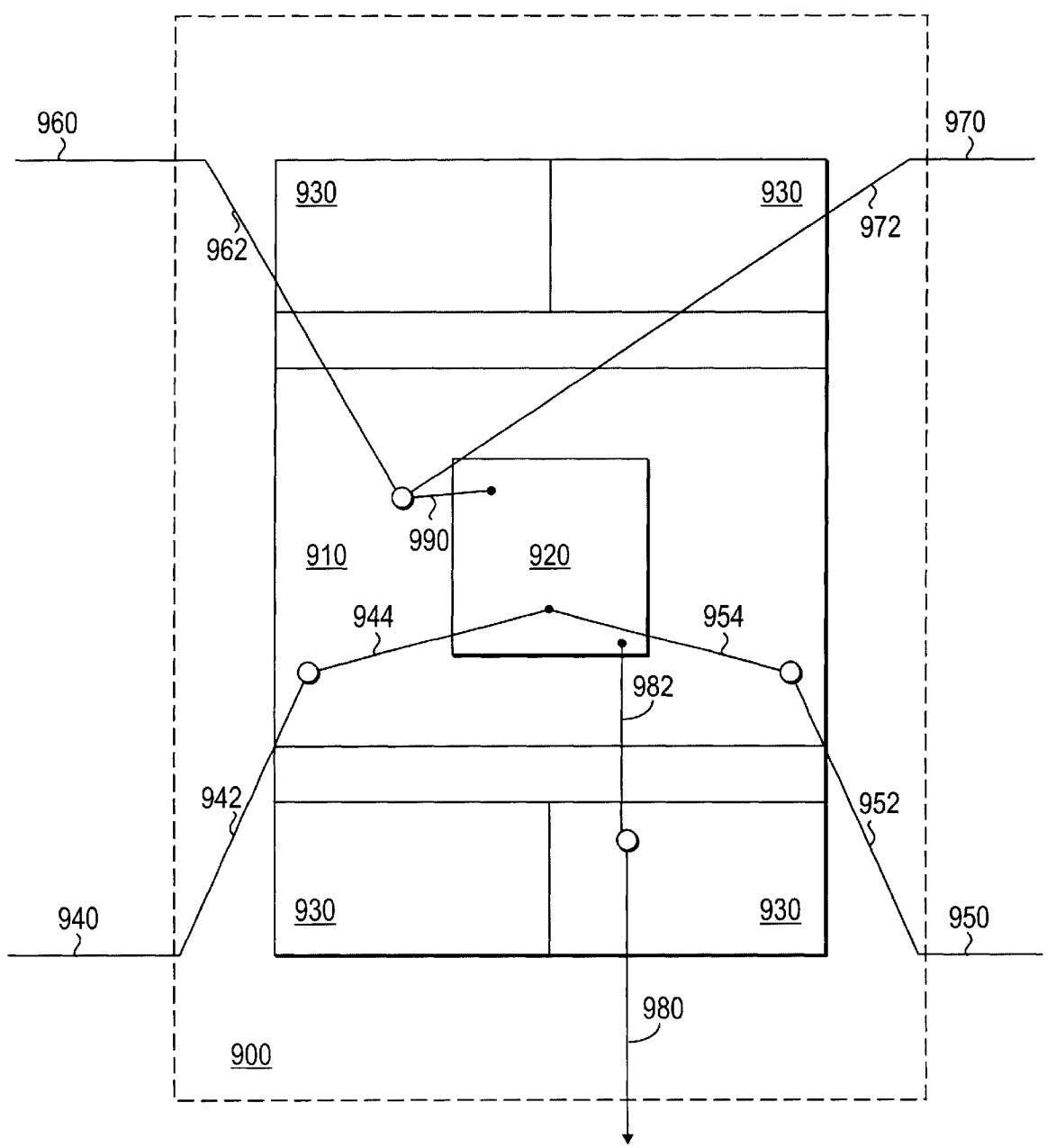
FIG. 9 illustrates an embodiment of a packaged integrated circuit and exemplary leads of a 5 load bus.

Turning to FIG. 9, an embodiment of a packaged integrated circuit and exemplary leads of a 5 load bus are illustrated. Packaged integrated circuit 920 is packaged in package 910 which is connected to interposer 900. Interposer 900 is connected to a printed circuit board (not shown).

Lead 960 of the printed circuit board is coupled to lead 962 of the interposer 900, which in turn is coupled to lead 990 of the package 910. Lead 990 is coupled at one end to a bond pad of integrated circuit 920, and at the other end to lead 972 of interposer 900 (as well as lead 962 of interposer 900). Lead 972 of interposer 900 is coupled to lead 970 of the printed circuit board.

Lead 940 of the printed circuit board is coupled to lead 942 of the interposer 900, which in turn is coupled to lead 944 of package 910. Lead 944 is coupled to a bond pad of integrated circuit 920. Lead 954 of package 910 is coupled to the same bond pad of integrated circuit 920 that lead 944 is coupled to, and lead 954 is also coupled to lead 952 of interposer 900. Lead 952 is also coupled to lead 950 of the printed circuit board.

Lead 982 of package 910 is coupled to a bond pad of integrated circuit 920 and to lead 980 of interposer 900. The coupling of lead 982 to lead 980 occurs in one of the interface areas 930 of package 910. Each interface area 930 is dedicated to an identical interface, such as a memory interface. Thus, one would expect, in one embodiment, to find a similar or identical set of leads in each of the other interface areas 930.

Figure 10:
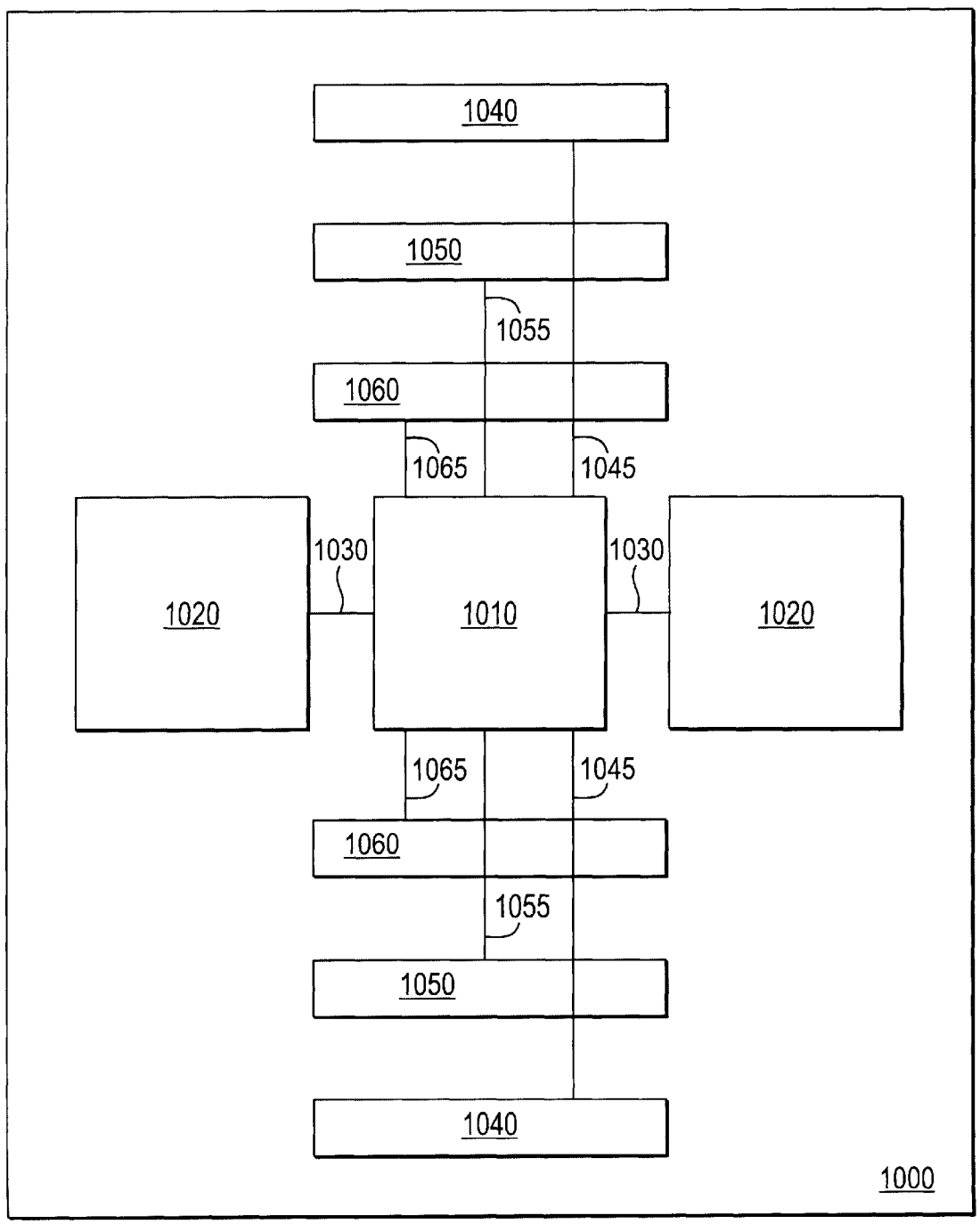
FIG. 10 illustrates a top-view of a printed circuit board.

Turning to FIG. 10, a top-view of a printed circuit board is illustrated. Printed circuit board 1000 has mounted on its top surface integrated circuit 1010 and first and second identical integrated circuits 1020. In one embodiment, printed circuit board also has mounted on its bottom surface third and fourth identical integrated circuits 1020 (not shown). Integrated circuit 1010 is coupled to each integrated circuit 1020 through a network of essentially identical leads 1030. In one embodiment, first integrated circuit 1020 and third integrated circuit 1020 are mounted directly opposite each other on printed circuit board 1000 and share most of a network of leads 1030 for communicating with integrated circuit 1010. Likewise, second integrated circuit 1020 and fourth integrated circuit 1020 are mounted directly opposite each other on printed circuit board 1000 and share most of a network of leads 1030 for communicating with integrated circuit 1010. As will be appreciated, this forms a five load bus topology when those leads 1030 are coupled to integrated circuit 1010 in a manner similar to that illustrated in FIG. 9 for example.

Integrated circuit 1010 is also coupled to first and second network of leads 1065, third and fourth network of leads 1055 and fifth and sixth network of leads 1045. First and second network of leads 1065 are coupled to first and second bus 1060. Third and fourth network of leads 1055 are coupled to third and fourth bus 1050. Fifth and sixth network of leads 1045 are coupled to fifth and sixth bus 1040.

In one embodiment, each of integrated circuits 1020 is a processor. Integrated circuit 1010 is a control hub such as a PCI control hub, memory control hub, or similar device suitable for controlling one or more buses and interfacing with multiple processors. Bus 1060 interfaces between the control hub and a memory system, such as Rambus RDRAM or conventional DRAM. Bus 1050 interfaces between input/output devices or an input/output hub, and bus 1040 interfaces with other input/output devices or is present for scalability of the system utilizing printed circuit board 1000. It will be appreciated that in this embodiment, integrated circuit 1010 may correspond to integrated circuit 920 of FIG. 9, having an interposer and package as well. Likewise, integrated circuits 1020 may correspond to integrated circuits 110, 120, 130 and 140 of FIG. 1, and integrated circuit 1010 may correspond to integrated circuit 150 of FIG. 1.

In the foregoing detailed description, the method and apparatus of the invention has been described with reference to specific exemplary embodiments thereof. It will, however, be evident that various modifications and changes may be made thereto without departing from the broader spirit and scope of the invention. For example, it will be apparent that termination of the leads may be accomplished with either series or parallel termination. Likewise, it will be appreciated that more than five loads may be accommodated on a bus without departing from the spirit and scope of the invention. The specification and figures are accordingly to be regarded as illustrative rather than restrictive.

What is claimed is:

1. An apparatus comprising:
   a bus having a first end and a second end;
   a first load coupled to the first end of the bus through a first path, wherein the first load has a driver capable of driving the bus and a receiver;
   a second load coupled to the first end of the bus through a second path, the second path substantially electrically identical to the first path, wherein the second load has a driver capable of driving the bus and a receiver;
   a third load coupled to the second end of the bus through a third path, the third path substantially electrically identical to the first path, wherein the third load has a driver capable of driving the bus and a receiver;

a fourth load coupled to the second end of the bus through a fourth path, the fourth path substantially electrically identical to the first path, wherein the fourth load has a driver capable of driving the bus and a receiver; and a fifth load coupled to the bus having a driver capable of driving the bus and a receiver; and wherein the bus incorporated in a printed circuit board, the printed circuit board having a first surface and a second surface, the first surface opposite the second surface;

the first load positioned at a first location on the first surface;

the second load positioned at a first location on the second surface, the first location on the second surface opposite the first location on the first surface;

the third load positioned at a second location on the first surface; and the fourth load positioned at a second location on the second surface, the second location on the second surface opposite the second location on the first surface.

2. The apparatus of claim 1 wherein:

the first load swizzled with the second load; and the third load swizzled with the fourth load.

3. The apparatus of claim 2 wherein:

the fifth load coupled to the bus through an interposer.

4. The apparatus of claim 2 further comprising:

the fifth load positioned on the printed circuit board at a third location on the first surface; and an underposer positioned at a third location on the second surface, the third location on the second surface opposite the third location on the first surface.

5. The apparatus of claim 2 wherein:

the fifth load coupled to the bus through an interposer, the interposer disposed between the fifth load and the printed circuit board.

6. A method comprising:

providing a bus;

providing five load devices;

coupling each load device of the five load devices to the bus;

terminating each coupling of each load device to the bus;

positioning the each of the first, second, third and fourth load devices at one of a first end or a second end of the bus;

wherein each of the five load devices have drivers capable of driving the bus and receivers; and swizzling bits of the load devices.

7. The method of claim 6 further comprising:

routing signals of the bus through a load device of the five load devices.

8. The method of claim 7 wherein:

coupling each load device to the bus includes providing traces between each load device and the bus having an impedance approximately the same as a termination impedance of the load device.

9. The method of claim 8 wherein:

the impedance of the bus is approximately half that of the termination impedance of the load devices.

10. A system comprising:

a bus, the bus incorporated in a printed circuit board, the printed circuit board having a first surface and a second surface, the first surface opposite the second surface;

a set of four processors including a first processor, a second processor, a third processor and a fourth processor, each processor coupled to one of a first end or a second end of the bus through a well terminated coupling, wherein each processor has a driver capable of driving the bus and a receiver, the first processor positioned at a first location on the first surface, the second processor positioned at a first location on the second surface, the first location on the second surface opposite the first location on the first surface, the third processor positioned at a second location on the first surface, the fourth processor positioned a t a second location on the second surface, the second surface opposite the second location on the first surface; and a control hub coupled to the bus at a location between the first end and the second end through a well terminated coupling, wherein the control hub has a driver capable of driving the bus and a receiver.

11. The system of claim 10 wherein:

the bus is routed through a portion of the control hub, the bus having a first portion incorporated in the printed circuit board between the first end and the control hub, a second portion incorporated in the printed circuit board between the second end and the control hub, and a third portion within the control hub.

12. The system of claim 10 wherein:

the control hub coupled to the bus through an interposer.

13. The system of claim 10 wherein:

the control hub positioned on the printed circuit board at a third location on the first surface; and further comprising an underposer positioned at a third location on the second surface, the third location on the second surface opposite the third location on the first surface, the bus is routed through a portion of the underposer, the bus having a first portion incorporated in the printed circuit board between the first end and the underposer, a second portion incorporated in the printed circuit board between the second end and the underposer, and a third portion within the underposer, the control hub coupled to the third portion of the bus through the printed circuit board.

14. The system of claim 10 wherein:

the bus is routed through a portion of the control hub.

* * * * *

UNITED STATES PATENT AND TRADEMARK OFFICE
CERTIFICATE OF CORRECTION

PATENT NO. : 6,417,688 B1
DATED : July 9, 2002
INVENTOR(S) : Dabral et al.

It is certified that error appears in the above-identified patent and that said Letters Patent is hereby corrected as shown below:

Drawings,
First drawing sheet, Fig. 1A, insert the legend -- (PRIOR ART) --.
Ninth drawing sheet, Fig. 5A, insert the legend -- (PRIOR ART) --.
Ninth drawing sheet, Fig. 6A, insert the legend -- (PRIOR ART) --.

Signed and Sealed this

Twenty-fifth Day of February, 2003

JAMES E. ROGAN
*Director of the United States Patent and Trademark Office*